(12) United States Patent
Miyajima

(10) Patent No.: US 7,061,580 B2
(45) Date of Patent: Jun. 13, 2006

(54) EXPOSURE APPARATUS AND DEVICE FABRICATION METHOD

(75) Inventor: Yoshikazu Miyajima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 113 days.

(21) Appl. No.: 10/824,989

(22) Filed: Apr. 15, 2004

(65) Prior Publication Data

US 2004/0207828 A1 Oct. 21, 2004

(30) Foreign Application Priority Data

Apr. 15, 2003 (JP) ............................. 2003-110210

(51) Int. Cl.
*G03B 27/42* (2006.01)
*G21K 5/00* (2006.01)

(52) U.S. Cl. .......................................... 355/53; 378/34

(58) Field of Classification Search ................. 355/53, 355/67, 77; 378/34, 35, 84, 85; 250/492.22
See application file for complete search history.

(56) References Cited

U.S. PATENT DOCUMENTS

| 5,448,612 | A | | 9/1995 | Kasumi et al. |
| 5,835,560 | A | * | 11/1998 | Amemiya et al. ............ 378/34 |
| 6,014,421 | A | * | 1/2000 | Chiba et al. .................. 378/34 |
| 6,757,051 | B1 | * | 6/2004 | Takahashi et al. ........... 355/67 |
| 2003/0043354 | A1 | * | 3/2003 | Butler ......................... 355/53 |

FOREIGN PATENT DOCUMENTS

| JP | 5-129188 | 5/1993 |
| JP | 6-267827 | 9/1994 |

* cited by examiner

*Primary Examiner*—Alan Mathews
(74) *Attorney, Agent, or Firm*—Morgan & Finnegan, LLP

(57) ABSTRACT

An exposure apparatus includes a reflective element for reflecting and introducing light from a light source to a plate, at least one first driver for providing the reflective element with a force and/or a displacement in at least one directions, and at least one second driver for providing the reflective element with a force and/or a displacement in at least one directions, wherein the first and second drives are connected in series to each other.

15 Claims, 9 Drawing Sheets

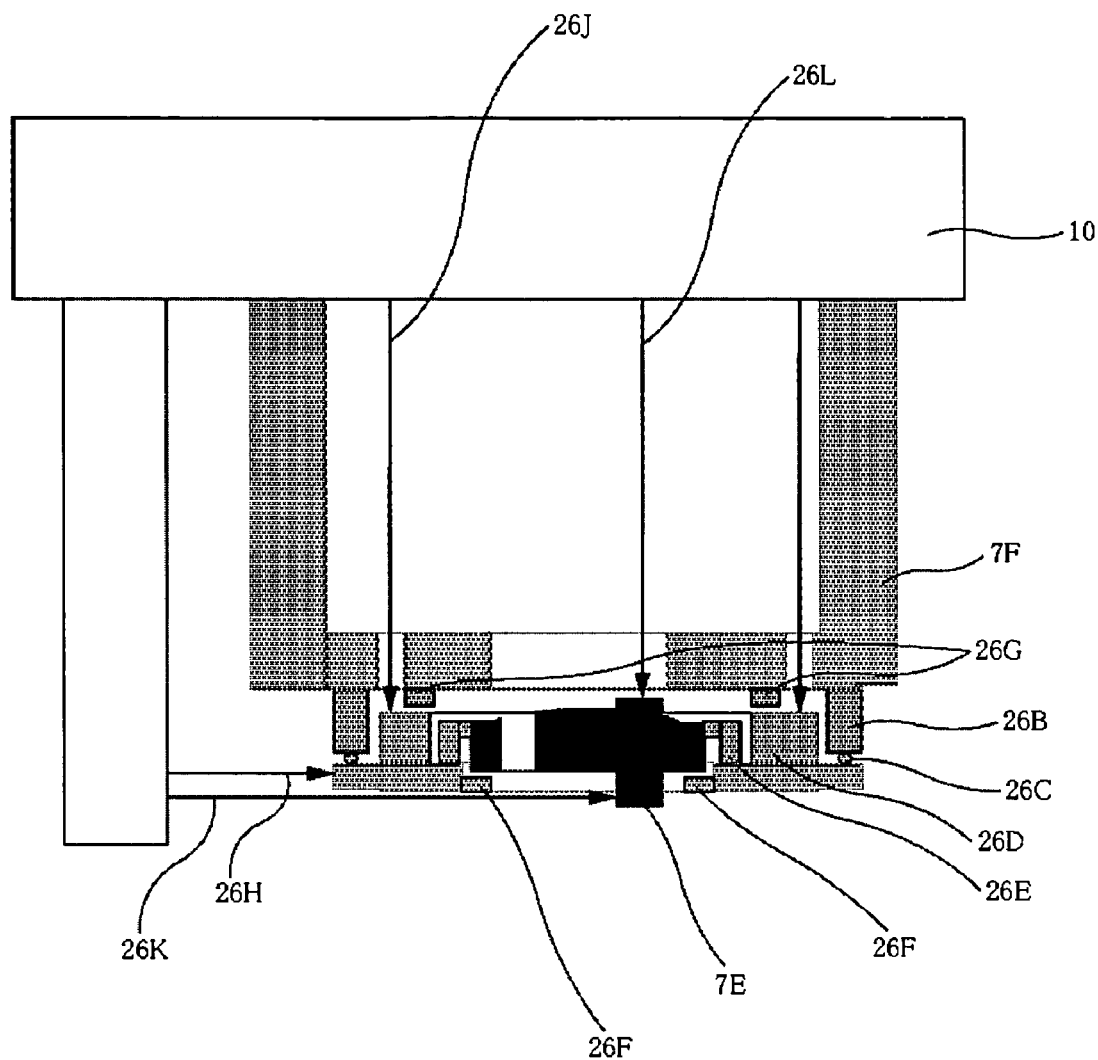
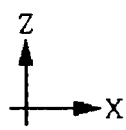
FIG. 3

MEASUREMENT ITEMS IN MIRROR SYSTEM
DISPLACEMENT MEASUREMENT ARITHMETIC CIRCUIT
(1) BETWEEN MIRROR BARREL AND MIRROR ELEMENT
DISPLACEMENT MEASUREMENT
BY DISPLACEMENT MEASUREMENT MEANS (XYZ)
AND SETTING ORIGIN FOR DRIVING RELATIVE TO MIRROR BARREL
(2) BETWEEN MIRROR ELEMENT AND MIRROR
DISPLACEMENT MEASUREMENT
BY DISPLACEMENT MEASUREMENT MEANS (XYZ)
AND SETTING ORIGIN FOR DRIVING RELATIVE TO MIRROR ELEMENT
(3) BETWEEN PROJECTION OPTICAL SYSTEM BODY AND MIRROR ELEMENT
MIRROR ELEMENT DISPLACEMENT MEASUREMENT
BY DISPLACEMENT MEASUREMENT MEANS (XYZ)
(4) BETWEEN PROJECTION OPTICAL SYSTEM BODY AND MIRROR
MIRROR DISPLACEMENT MEASUREMENT
BY DISPLACEMENT MEASUREMENT MEANS (XYZ)

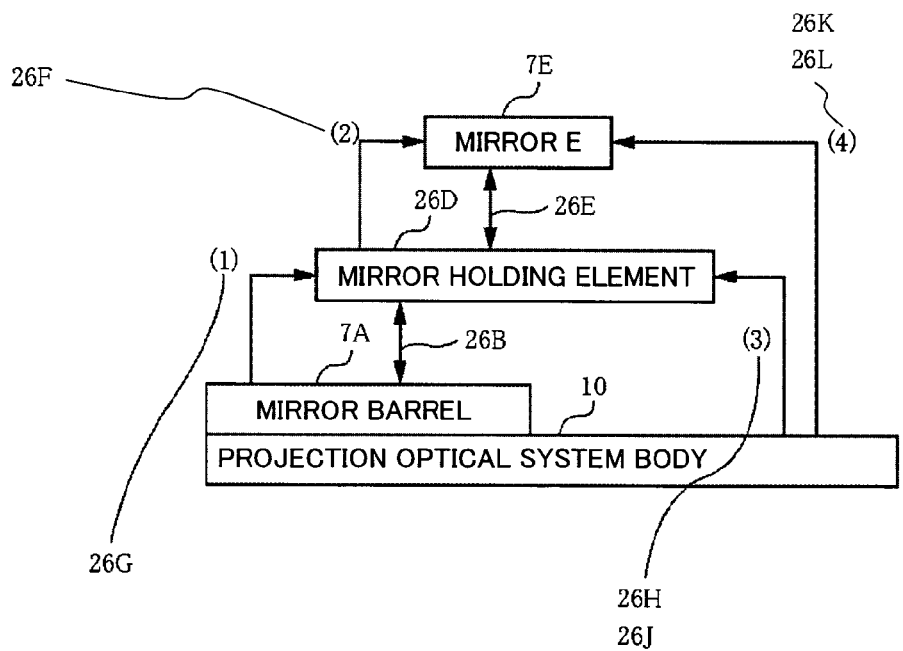

FIG. 4

PRIOR ART

EXPOSURE APPARATUS AND DEVICE FABRICATION METHOD

This application claims a benefit of priority based on Japanese Patent Application No. 2003-110210, filed on Apr. 15, 2003, which is hereby incorporated by reference herein in its entirety as if fully set forth herein.

BACKGROUND OF THE INVENTION

The present invention relates to an exposure apparatus used for a semiconductor manufacturing process, and a projection exposure apparatus that projects and transfers a reticle pattern onto a silicon wafer. The present invention is suitable for an extreme ultraviolet ("EUV") exposure apparatus that uses EUV light as exposure light with a wavelength of about 13 to 14 nm and a mirror optical system for projection exposure in vacuum.

A prior art example will be described with reference to FIGS. 6 and 7. 101 uses a YAG solid laser etc., and serves as an excitation laser for exciting light-source material atoms into plasma for light emissions by irradiating a laser beam onto an emitting point of the light source, at which the light-source material is in a state of gas, liquid or atomized gas. 102 is a light-source emitting part that maintains an internal structure to be vacuum. Here, 102A is a light source A indicative of an actual emitting point of an exposure light source.

103 is a vacuum chamber for accommodating an exposure apparatus entirely, which can maintain the vacuum state using a vacuum pump 104. 105 is an exposure light introducing part for introducing exposure light from the light-source emitting part 102, which includes mirrors A (or 105A) to D (or 105D), and homogenizes and shapes the exposure light.

106 is a reticle stage, and a movable part of the reticle stage is mounted with a reflective original form 106A that forms a pattern to be exposed.

107 is a reduction projection mirror optical system that reduces and projects an exposure pattern reflected from the original form 106A through mirrors A (or 107A) to E (or 107E) sequentially at predefined reduction ratio.

108 is a position-controlled wafer stage for positioning a wafer 108A as a Si substrate onto a predetermined exposure position so that the wafer stage can be driven in six axes directions, i.e., driven in XYZ directions, tilt around the XY axes, and rotated around the Z axis. The pattern on the original form 106A is to be reflectively reduced and projected onto the wafer 108A.

109 is a reticle stage support for supporting the reticle stage 105 on the apparatus installation floor. 110 is a projection optical system body for supporting the reduction projection mirror optical system 107 on the apparatus installation floor. 111 is a wafer stage support for supporting the wafer stage 108 on the apparatus installation floor.

Provided between the reticle stage 105 and the reduction projection mirror optical system 107 and between the reduction projection mirror optical system 107 and the wafer stage 108, which are distinctly and independently supported by the reticle stage support 109, the projection optical system body 110 and the wafer stage support 111, are means (not shown) for measuring relative positions to continuously maintain a predetermined arrangement of them.

A mount (not shown) for violation isolation from the apparatus installation floor is provided on the reticle stage support 109, the projection system body 110, and the wafer stage 111.

112 is a reticle stocker as a storage container that temporarily stores, in an airtight condition, plural original forms 106A as reticles supplied from the outside of the apparatus and suitable for different exposure conditions and patterns. 113 is a reticle changer for selecting and feeding a reticle from the reticle stocker 112.

114 is a reticle alignment unit that includes a rotatable hand that is movable in the XYZ directions and rotatable around the Z axis. The reticle alignment unit 114 receives the original form 106A from the reticle changer 113, rotates it by 180°, and feeds it to the reticle alignment scope 115 provided at the end of the reticle stage 106 for fine movements of the original form 106A in the XYZ-axes rotating directions and alignment with respect to the alignment mark 115A provided on the reduction projection mirror optical system 107. The aligned original form 106A is chucked on the reticle stage 106.

116 is a wafer stocker as a storage container for temporarily storing plural wafers 108A from the outside to the inside of the apparatus. 117 is a wafer feed robot for selecting a wafer 108A to be exposed, from the wafer stocker 116, and feeds it to a wafer mechanical pre-alignment temperature controller 118 that roughly adjusts feeding of the wafer in the rotational direction and controls the wafer temperature within predetermined controlled temperature in the exposure apparatus.

119 is a wafer feed hand that feeds the wafer that has been aligned and temperature-controlled by the wafer mechanical pre-alignment temperature controller 118 to the wafer stage.

120 and 121 are gate valves that constitute a gate opening/closing mechanism for supplying the reticle and wafer from the outside of the apparatus. 122 is also a gate valve that uses a diaphragm to separate a space of the wafer mechanical pre-alignment temperature controller 118 from an exposure space, and opens and closes only when feeding in and out the wafer.

Such a separation using the diaphragm can minimize a capacity to be temporarily released to the air, and form a vacuum equilibrium state.

Thus, when the conventionally structured exposure apparatus supports and positions the mirrors A to E relative to the mirror barrel 107F as shown in FIG. 7, fine displacements and inclinations of the rotational axis in the in-plane translation shift direction occur, and the mirror deforms by its own weight. This cannot satisfy extremely strict mirror surface shape precisions below about 1 nm necessary for the projection optical system mirrors, the illumination optical system mirrors, and the light source mirrors.

When the mirror's surface precision and thus the optical aberration deteriorate, the projection optical system, in particular, deteriorates imaging performance to the wafer and lowers light intensity.

The exposure light introducing part introduces the exposure light from the light-source emitting part in such a conventionally structured exposure apparatus. The reduction projection mirror optical system reduces and projects the exposure pattern reflected from the original form illuminated by the mirrors A to D in the exposure light introducing part. The reduction projection mirror optical system makes a multilayer of Mo—Si on each of the mirrors A to E by vacuum evaporation or sputtering, and reflects the exposure light from the light source on each reflective surface. In this case, the reflectance per surface is about 70%; the rest is absorbed in the mirror base material and converted into heat. The temperature rises by about 10 to 20° C. in the exposure light reflecting area, and the reflective surface deforms by about 50 to 100 nm around the mirror peripheral even when the mirror uses a material having an extremely small coefficient of thermal expansion. As a result, extremely strict mirror surface shape precisions below about 1 nm necessary for the projection optical system mirrors, the illumination optical system mirrors, and the light source mirrors cannot be maintained. When the mirror surface precision, the projection optical system deteriorates imaging performance to the wafer and lowers light intensity.

In addition, the illumination optical system lowers the target light intensity, and causes non-uniform light intensity. The light source mirror deteriorates the light intensity, such as insufficient condensing. They result in deteriorated basic performance of the exposure apparatus, such as exposure precision and throughput.

BRIEF SUMMARY OF THE INVENTION

Accordingly, it is an exemplary object of the present invention to provide an exposure apparatus that can precisely control wave front aberration of a projection optical system and has high imaging performance.

An exposure apparatus of one aspect according to the present invention includes a reflective element for reflecting and introducing light from a light source to a plate, at least one first driver for providing the reflective element with a force and/or a displacement in at least one directions, and at least one second driver for providing the reflective element with a force and/or a displacement in at least one directions, wherein the first and second drives are connected in series to each other.

An exposure apparatus of another aspect according to the present invention for introducing light from a light source to a plate includes a barrel, a support member, a reflective element for reflecting light from the light source to the plate, at least one first driver, connected to said barrel and support member, for providing a force and/or a displacement in at least one directions, and at least one second driver, connected to said barrel and reflective element, for providing a force and/or a displacement in at least one directions.

A device fabrication method of another aspect according to the present invention includes the steps of exposing a plate using the above exposure apparatus; and developing the plate that has been exposed.

BRIEF DESCRIPTION OF THE DRAWINGS

FIG. 3 is a detailed view of mirrors in a projection optical system of the embodiment.

FIG. 4 is a view for explaining a measurement unit for mirrors in a projection optical system of the embodiment.

DETAILED DESCRIPTION OF THE PREFERRED EMBODIMENTS

Figure 1:
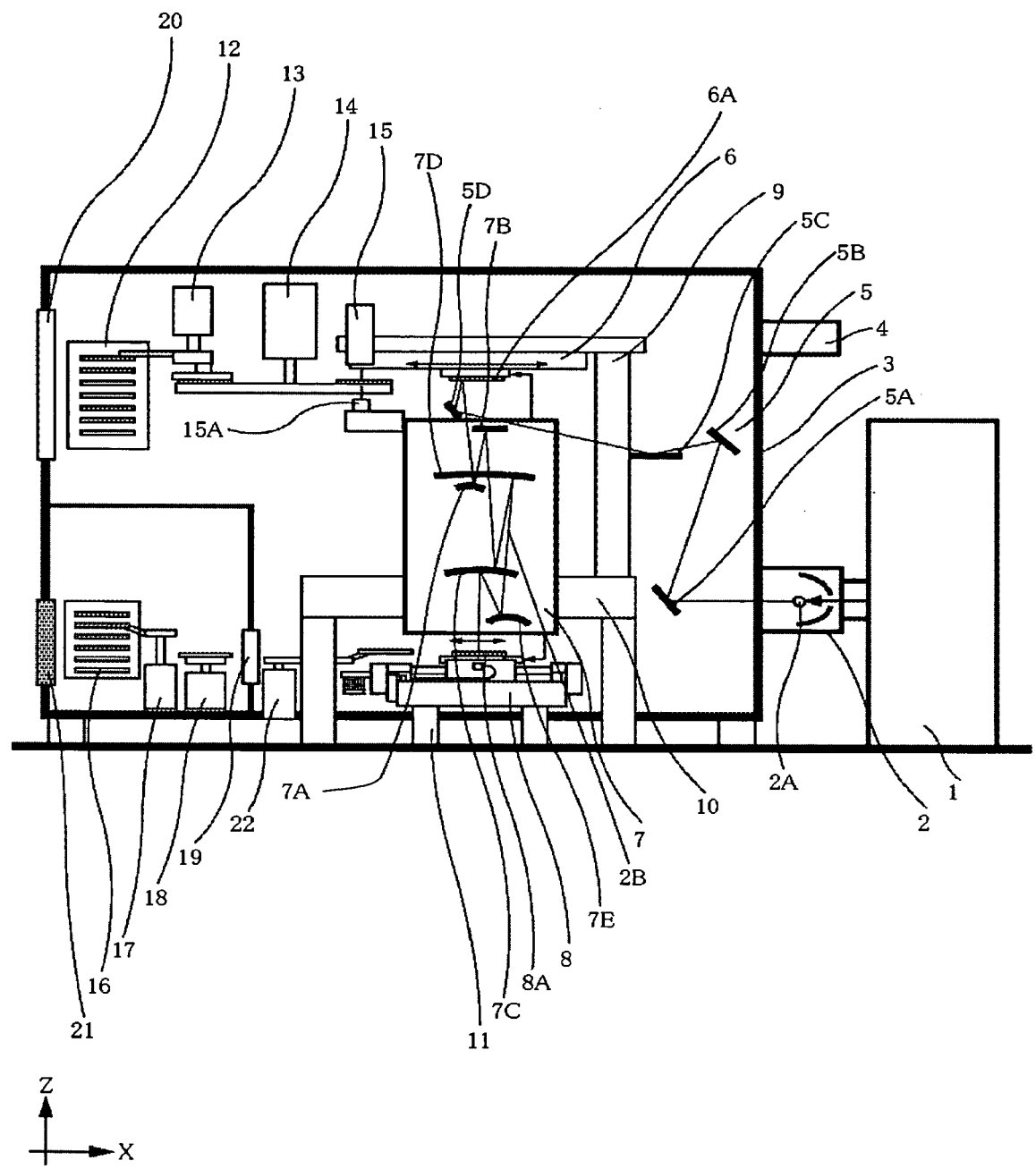
FIG. 1 is an overview of an exposure apparatus of an embodiment.

A description will be given of an embodiment according to the present invention with reference to FIGS. 1 to 5.

1 uses a YAG solid laser etc., and serves as an excitation laser for exciting light-source material atoms into plasma for light emissions by irradiating a laser beam onto an emitting point of the light source, at which the light-source material is in a state of gas, liquid or atomized gas. 2 is a light-source emitting part that maintains an internal structure to be vacuum. Here, 2A is a light source A indicative of an actual emitting point of an exposure light source.

3 is a vacuum chamber for entirely accommodating an exposure apparatus, which can maintain the vacuum state using a vacuum pump 4.

5 is an exposure light introducing part for introducing exposure light from the light-source emitting part 2, which includes mirrors A (or 5A) to D (or 5D), and homogenizes and shapes the exposure light. Of course, the number of mirrors in the exposure light introducing part is not limited to four, and may be five, six, seven, eight, or another number.

6 is a reticle stage, and a movable part of the reticle stage is mounted with a reflective original form 6A that forms a pattern to be exposed.

7 is a reduction projection mirror optical system that reduces and projects an exposure pattern reflected from the original form through mirrors A (or 7A) to E (or E) sequentially at predefined reduction ratio. 7F is a mirror barrel that holds mirrors A to E.

8 is a position-controlled wafer stage for positioning a wafer 8A as a Si substrate onto a predetermined exposure position so that the wafer stage can be driven in six-axes directions, i.e., driven in XYZ directions, tilt around the XY axes, and rotated around the Z axis. The pattern on the original form is to be reflectively reduced and projected onto the wafer 8A.

9 is a reticle stage support for supporting the reticle stage 5 on the apparatus installation floor. 10 is a projection optical system body for supporting the reduction projection mirror optical system 7 on the apparatus installation floor. 11 is a wafer stage support for supporting the wafer stage 8 on the apparatus installation floor.

Provided between the reticle stage 5 and the reduction projection mirror optical system 7 and between the reduction projection mirror optical system 7 and the wafer stage 8, which are distinctly and independently supported by the reticle stage support 9, the projection optical system body 10 and the wafer stage support 11, are means (not shown) for measuring relative positions to continuously maintain a predetermined arrangement of them.

A mount (not shown) for violation isolation from the apparatus installation floor is provided on the reticle stage support 9, the projection system body 10, and the wafer stage 11.

12 is a reticle stocker as a storage container that temporarily stores, in an airtight condition, plural original forms as reticles supplied from the outside of the apparatus and suitable for different exposure conditions and patterns. 13 is a reticle changer for selecting and feeding a reticle from the reticle stocker 12.

14 is a reticle alignment unit that includes a rotatable hand that is movable in the XYZ directions and rotatable around the Z axis. The reticle alignment unit 14 receives the original form from the reticle changer 13, rotates it by 180°, and feeds it to the reticle alignment scope 15 provided at the end of the reticle stage 6 for fine movements of the original form 6A in the XYZ-axes rotating directions and alignments with respect to the alignment mark 15A provided on the reduction projection mirror optical system 7. The aligned original form is chucked on the reticle stage 6. 16 is a wafer stocker as a storage container for temporarily storing plural wafers from the outside to the inside of the apparatus. 17 is a wafer feed robot for selecting a wafer to be exposed, from the wafer stocker, and feeds it to a wafer mechanical pre-alignment temperature controller 18 that roughly adjusts feeding of the wafer in the rotational direction and controls the wafer temperature within predetermined controlled temperature in the exposure apparatus. 19 is a wafer feed hand that feeds the wafer that has been aligned and temperature-controlled by the wafer mechanical pre-alignment temperature controller 18 to the wafer stage. 20 and 21 are gate valves that constitute a gate opening/closing mechanism for supplying the reticle and wafer from the outside of the apparatus. 22 is also a gate valve that uses a diaphragm to separate a space of the wafer mechanical pre-alignment temperature controller 18 from an exposure space, and opens and closes only when feeding in and out the wafer.

Such a separation using the diaphragm can minimize a capacity to be temporarily released to the air, and form a vacuum equilibrium state.

The above structure further includes, as a solution for insufficient positional shape precision problems in the prior art, means for correcting a mirror position, surface precision, and projection optical system's wave front aberration.

Figure 2:
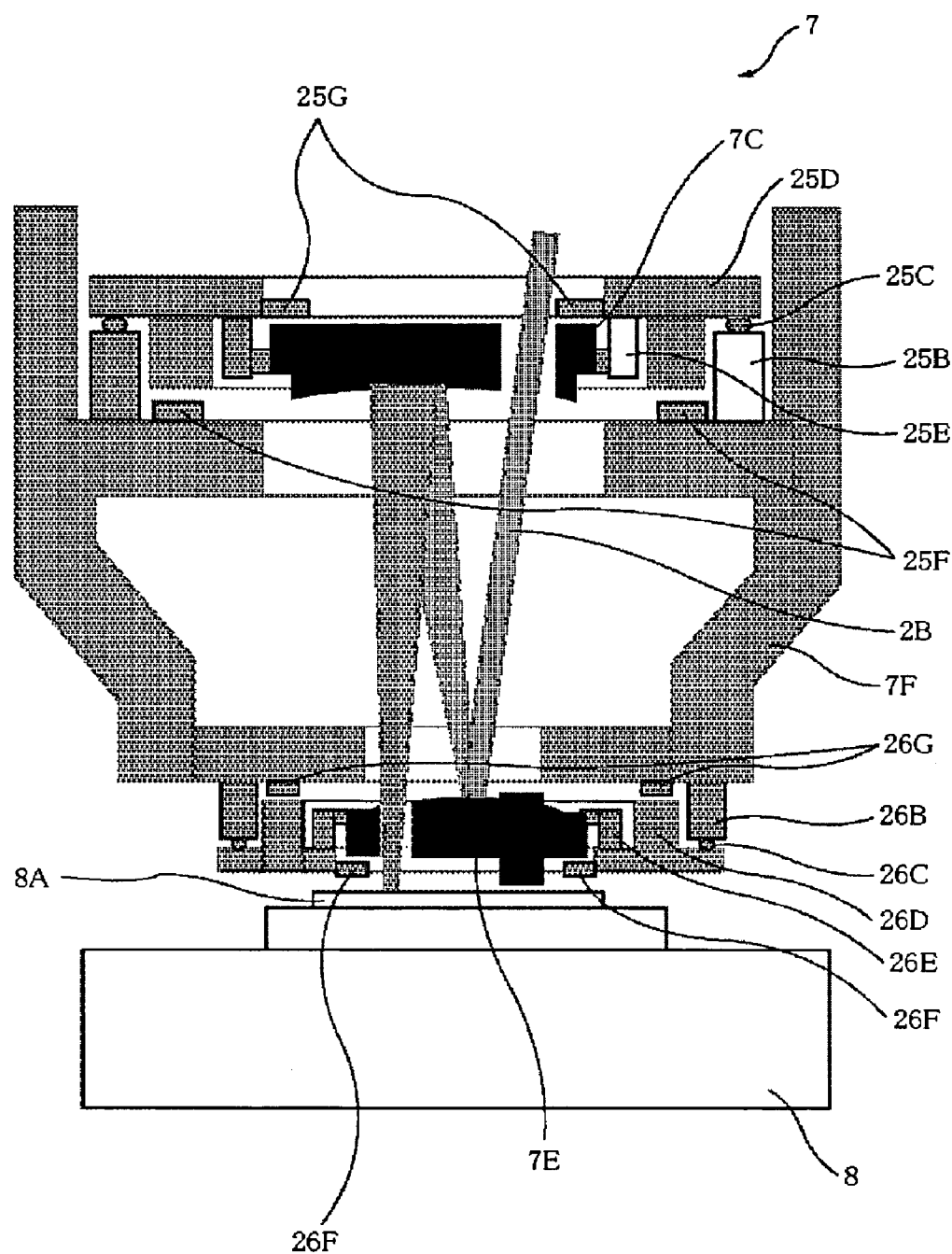
FIG. 2 is a detailed view of mirrors in a projection optical system of the embodiment.

FIG. 2 exemplarily shows mirrors C (or 7C) and E (or 7E) in the reduction projection mirror optical system. The mirror C is supported in the mirror barrel 7F via plural rough-movement drive means 25B, plural element positioners 25C, mirror holding element 25D, and plural fine-movement drive means 25E in this order from the mirror barrel 7F. In other words, the above rough-movement drive means and fine-movement drive means can drive the mirror C relative to the mirror barrel 7F. There may be only one rough-movement drive means and only one fine-movement drive means, but the exposure apparatus preferably includes three each, and more preferably each being drivable in two directions. The instant embodiment provides three rough-movement drive means between the mirror barrel and the mirror holding element. Control over the rough-movement drive means makes the mirror holding element drivable in six-axes directions or six degrees of freedom relative to the mirror barrel. In addition, three fine-movement drive means are provided between the mirror holding element and the mirror, and control over the fine-movement drive means makes the mirror drivable in six-axes directions or six degrees of freedom relative to the mirror holding element (and the mirror barrel). In other words, the rough and fine movements of the mirror in six-axes directions are available by a series connection of the rough-movement drive means and fine-movement drive means between the mirror barrel and the mirror. The minimum drive amount of the actuator attached to the fine-movement drive means is made larger than the preferably double or more preferably triple of the minimum drive amount of the driven part in the fine-movement drive means.

The minimum driving unit (such as a distance and an angle) in the rough-movement drive means is made larger than the minimum driving unit in the fine-movement drive means. The minimum driving unit in the rough-movement drive means is made larger than the preferably double or more preferably decuple of the minimum driving unit in the fine-movement drive means.

There are plural mirror rough-movement displacement measuring means 25F between the mirror barrel and the mirror holding element 25D, for measuring a displacement of the mirror holding element 25D driven by the rough-movement drive means 25B. In addition, there are plural mirror fine-movement displacement measuring means 25G between the mirror holding element 25D and the mirror C, for measuring a displacement of the mirror C driven by the fine-movement drive means 25B.

A similar structure that includes plural rough-movement drive means 26B, plural element positioning members 26C, mirror holding elements 26D plural fine-movement drive means 26E in this order from the mirror barrel 7E side is provided for the mirror E, like the mirror C. In other words, the above rough-movement drive means and fine-movement drive means can drive the mirror E relative to the mirror barrel 7E. Here, there may be only one rough-movement drive means and only one fine-movement drive means, but the exposure apparatus preferably includes three (or more) each, and more preferably each being drivable in two directions.

There are plural mirror rough-movement displacement measuring means 26F between the mirror barrel and the mirror holding element as means for measuring a position of the mirror E relative to the mirror barrel. The mirror rough-movement displacement measuring means 26F measures a displacement of the mirror holding element 26D driven by the rough-movement drive means 26B. There are plural mirror fine-movement displacement measuring means 26G for measuring a displacement of the mirror E driven by the fine-movement drive means 26E, between the mirror holding element 26D and the mirror E.

The measuring means for the mirror relative to the mirror barrel and the mirror holding element provides origins of the mirror rough-movement drive means and fine-movement drive means. By this origin setting, the measurements of the positions among mirrors relative to the mirror barrel are available.

In addition to measurements of the positions among mirrors relative to the mirror barrel, measuring means, such as a laser interferometer, is provided as means for precisely measuring a mirror position (with precision below 1 nm), so as to narrow down the reflective surface precision of each mirror within a target surface precision from the projection optical precision. A description will now be given of the measurement method using this laser interferometer.

FIG. 3 shows a mirror position measured by the laser interferometer. As shown in a view of the mirror E, the measurement reflective surface is provided on the mirror itself, and respective mirror positions and relative positions from the projection optical system body 10 are measured.

In order to XY measurements of the mirror holding element 26D, the measurement light of the mirror displacement measuring means 26H by the laser interferometer, etc. is irradiated onto the reflective surface provided on the mirror holding element 26D, and the displacement changes are measured by the laser Doppler displacement measurement method, etc.

Similarly, the mirror displacement measuring means 26J measures a displacement in the Z direction of the mirror holding element 26D. In addition, the measurement light of the laser interferometer is irradiated onto the reflective surface provided on the mirror from the mirror displacement measuring means 26K and mirror displacement measuring means 26L for XYZ measurements of the mirror E, and the XYZ displacement changes of the mirror is measured by the laser Doppler displacement measurement method, etc.

The above measuring means sets an origin for the mirror E relative to the mirror barrel 7F, and drives the mirror E to the geometrical design center position. The optical-axis adjustment and aberrational corrections for the total reflection mirror in the projection optical system are conducted at the geometrical design center position.

By providing means that uses the laser interferometer, etc. to precisely measure the displacement measuring means of the mirror E from the projection optical system body, the mirror is driven and narrowed down to the target optical aberration using the aberrational target value as an origin through the total reflection mirror in the projection optical system.

Figure 5:
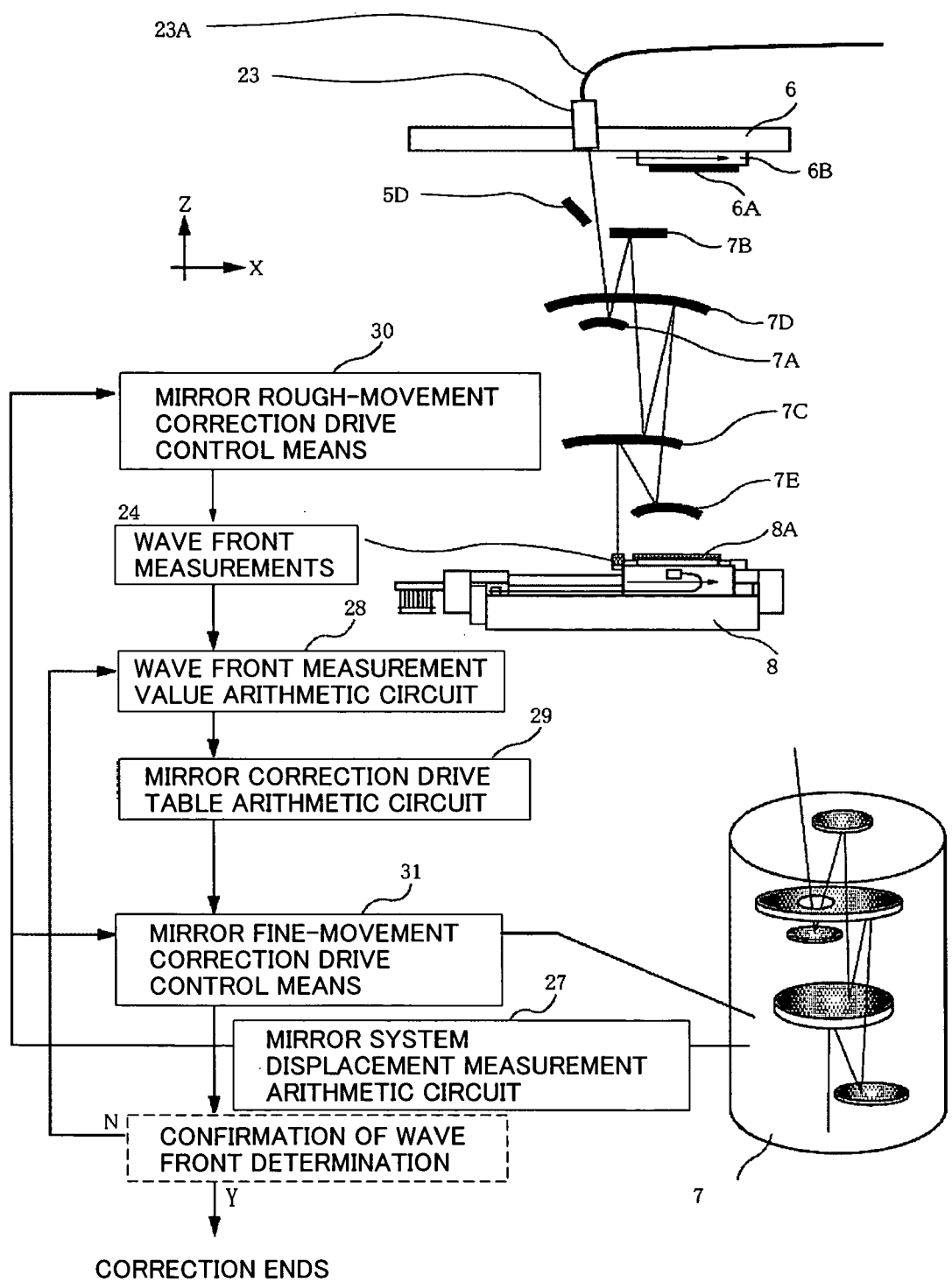
FIG. 5 is a structural view of a wave front measurement unit for mirrors of the embodiment.
Figure 6:
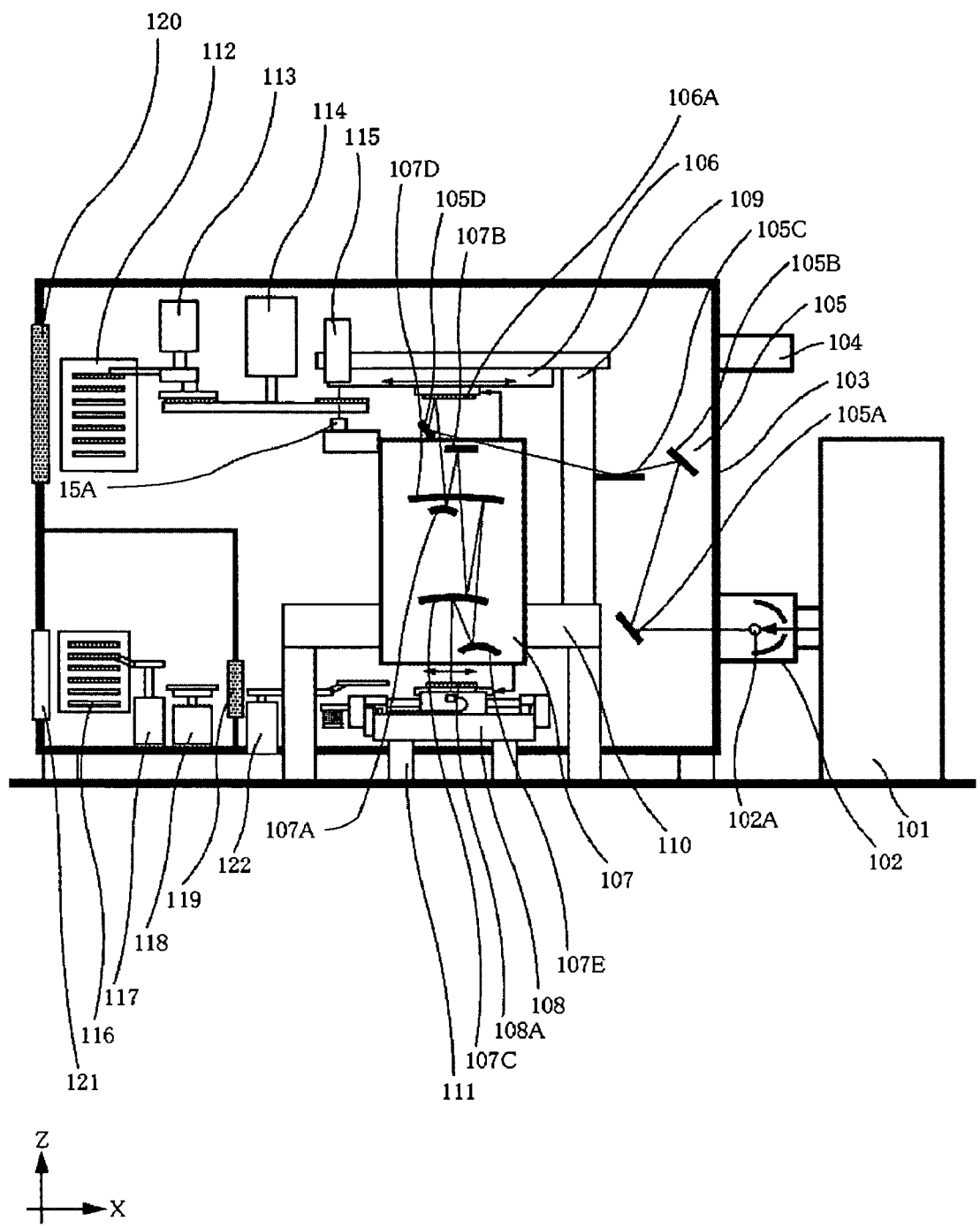
FIG. 6 is an overview of a conventional exposure apparatus.
Figure 7:
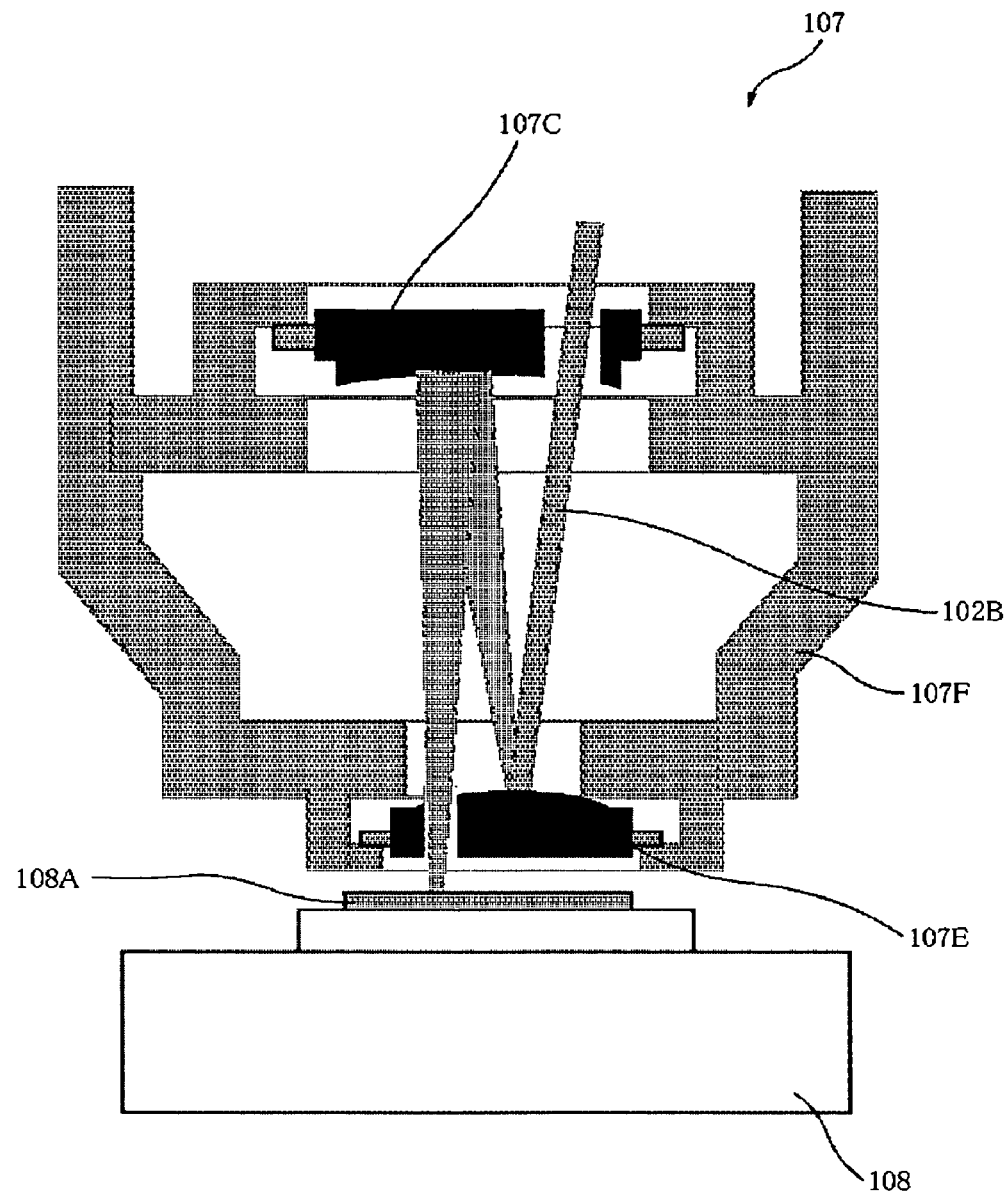
FIG. 7 is a structural view of mirrors in a conventional projection optical system.

A description will now be given of the measurement method of the aberrational target value through the total reflection mirror in the projection optical system. While the reticle stage slider 6B retracts of the reticle stage 6, as shown in FIG. 5, the measurement light emitted from a measurement light source supply fiber 23A for a wave front measuring unit is emitted from the measurement light source emission opening 23 in the wave front measuring unit that emits the wave front evaluation light source light. The measurement light is reflected on the entire surface of the reflective surface on the mirror in the projection optical system, and the wave front measurement light-receiving sensor 24 installed on the wafer stage movable part 8 measures the optical wave front aberration of the projection optical system on the mirror's entire reflective surface, as illustrated.

Next, a wave front measurement value arithmetic circuit calculates the wave front aberration amount based on the wave front measurement value measured by the wave front measurement light-receiving sensor. A mirror correction drive table arithmetic circuit 29 calculates corrective drive directions, drive amounts, and applied power amounts of mirrors A to E based on this wave front measurement operational value, and transmits them as target values to the mirror fine-movement correction drive means 31.

Simultaneously, regarding the positional information of the mirrors A to E, the mirror system displacement measurement arithmetic circuit collects signals from the mirror displacement measuring means 26F, 26G, etc. and mirror displacement measuring means (laser interferometers) 26K, 26L, 26H, 26J, etc., and measures the mirror positions relative to the projection optical system body and the mirror barrel and relative positions among mirrors.

After the fine-movement drive means 26E and rough-movement drive means 26B drive each mirror to a target position, the wave front measurement is confirmed again. When the wave front aberration meets the predefined value, the correction ends. When the wave front aberration does not meet the specification, the wave front measurement arithmetic circuit calculates the remaining wave front aberration amount again, and the above correction is repeated for narrowing down to the target specification.

The target wave front aberration amount is one obtained after the projection optical system solely adjusts a mirror position initially, and narrows down the aberration below the appropriate target amount. This aberration amount is an origin of the target aberration and mirror position shape in the apparatus.

It is possible to narrow down the aberration close to the target position by driving the mirror using the rough-movement drive means.

While the instant embodiment drives the mirror using two members, i.e., the rough-movement drive means and the fine-movement drive means, the number of members is not limited to two and three or more drive means can be used to drive the mirror relative to the mirror barrel body.

While the instant embodiment uses two types of measuring means, i.e., the rough-movement measuring means and the fine-movement measuring means, to measure mirror positions relative to the mirror barrel body, the mirror position relative to the mirror barrel body can be measured directly: The position measuring means provided on the mirror barrel body can be used to measure the mirror position. Alternatively, a position measuring means is provided on a stool in the exposure apparatus so as to measure a mirror position.

Since it is conceivable that the wave front aberration changes according to the temperature and other conditions in the exposure space, it is preferable to measure the wave front aberration regularly and drive the mirror based on the measurement result. If necessary, a wafer can be exposed by driving the mirror.

For driving of the mirror, the rough-movement drive means and the fine-movement drive means are provided in a direction in which the wave front aberration sensitively changes as the mirror drives. When the wave front aberration changes are insensitive to the driving of the mirror, only the rough-movement drive means can be provided.

While the instant embodiment measures the wave front aberration on the exposure apparatus body, the wafer is exposed on the regular basis, and the mirror may be driven based on the exposure result. A predicted value of a change of the wave front aberration is stored as data in advance, and the mirror may be driven based on the stored changes of the wave front aberration.

Figure 8:
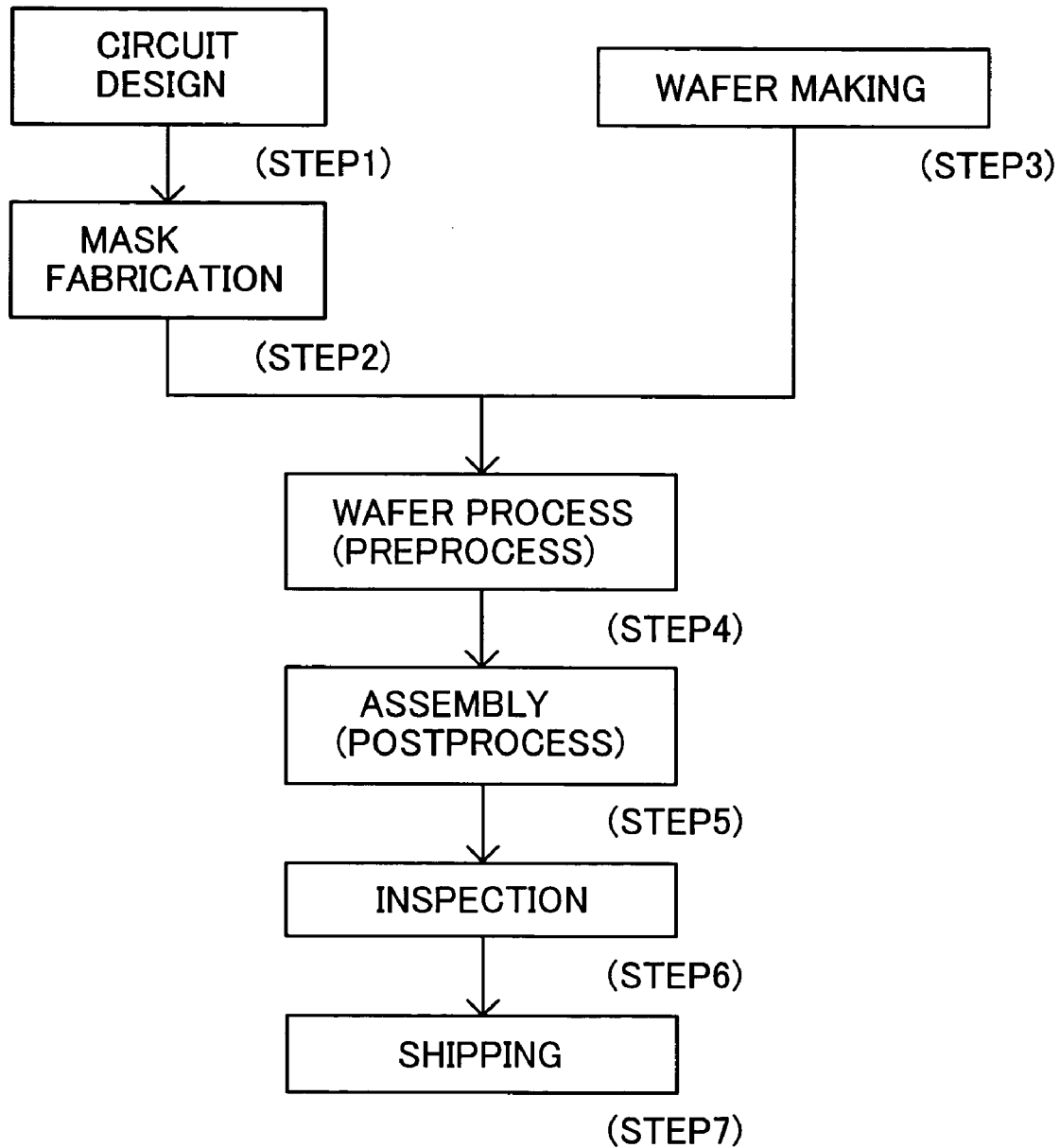
FIG. 8 is a flowchart for explaining a method for fabricating devices (semiconductor chips such as ICs, LSIs, and the like, LCDs, CCDs, etc.).
Figure 9:
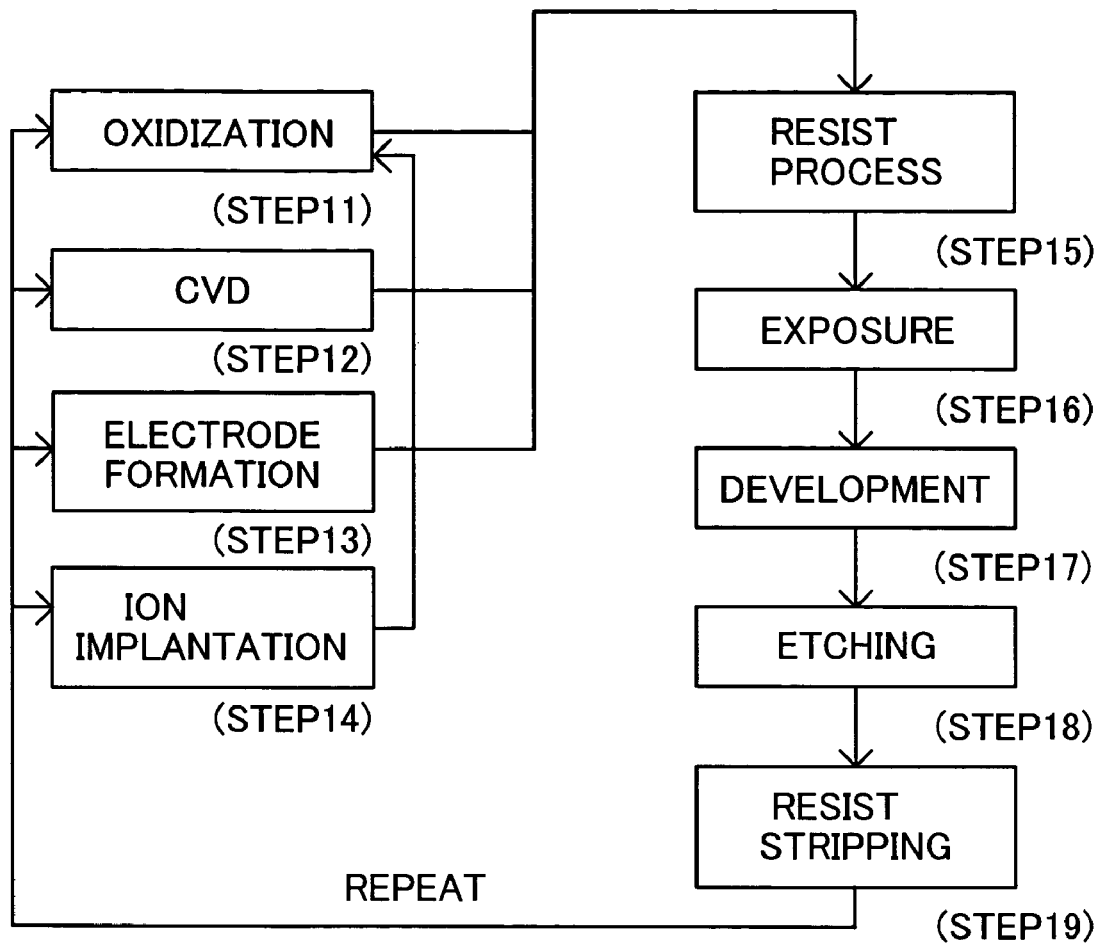
FIG. 9 is a detailed flowchart for Step 4 of wafer process shown in FIG. 8.

Referring to FIGS. 8 and 9, a description will now be given of an embodiment of a device fabricating method using the above exposure apparatus. FIG. 8 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Thus, the device fabrication method using the exposure apparatus, and the devices as finished goods also constitute one aspect of the present invention.

According to the instant embodiment, the exposure apparatus can correct fine displacements and inclinations of the rotational axis in the in-plane translation shift direction, mirror's deformations due to its own weight, and wave front aberration in the projection optical system mirrors, preventing the mirror surface precision and thus the optical aberration, and deteriorated imaging performance and lowered light intensity in the projection optical system.

What is claimed is:

1. An exposure apparatus comprising:
    a reflective element for reflecting and introducing light from a light source to a plate;
    at least one first driver for providing the reflective element with a force and/or a displacement in at least one directions;
    at least one second driver for providing the reflective element with a force and/or a displacement in at least one directions, wherein said first and second drives are connected in series to each other;
    a first measurement unit for measuring a relative position between one end and another end of said first driver; and
    a second measurement unit for measuring a relative position between one end and another end of said second driver.

2. An exposure apparatus according to claim 1, wherein the first and second drives provide the reflective element with the displacements, and a minimum unit of a displacement amount by said second driver is smaller than that by said first driver.

3. An exposure apparatus according to claim 1, wherein a minimum unit of a displacement amount by said first driver is larger than double of a minimum unit of a displacement amount by said second driver.

4. An exposure apparatus according to claim 1, wherein said second driver has higher control precision than said first driver.

5. An exposure apparatus according to claim 1, wherein said second driver has a higher control frequency than said first driver.

6. An exposure apparatus according to claim 1, further comprising:
    a first measurement unit for measuring a displacement amount of the reflective element by said first driver; and
    a second measurement unit for measuring a displacement amount of the reflective element by said second driver.

7. An exposure apparatus according to claim 1, wherein said exposure apparatus is a scanning exposure apparatus that provides exposure by relatively scanning the original form and the plate.

8. An exposure apparatus according to claim 1, wherein an optical path from the light source to the plate is maintained substantially vacuum.

9. An exposure apparatus according to claim 1, wherein the light from the light source has a wavelength between 13 and 14 nm.

10. An exposure apparatus comprising:
    a reflective element for reflecting and introducing light from a light source to a plate;
    at least one first driver for providing the reflective element with a force and/or a displacement in at least one directions;
    at least one second driver for providing the reflective element with a force and/or a displacement in at least one directions, wherein said first and second drives are connected in series to each other;
    a projection optical system, provided with said reflective element, for introducing to the plate light from the pattern illuminated by the light from the light source; and
    a wave front aberration measurement unit for measuring wave front aberration in said projection optical system, wherein the reflective element is driven based on a measurement result by said wave front aberration measurement unit.

11. An exposure apparatus comprising:
    a reflective element for reflecting and introducing light from a light source to a plate;
    at least one first driver for providing the reflective element with a force and/or a displacement in at least one directions;
    at least one second driver for providing the reflective element with a force and/or a displacement in at least one directions, wherein said first and second drives are connected in series to each other;
    a projection optical system, provided with said reflective element, for introducing to the plate light from the pattern illuminated by the light from the light source;
    a wave front aberration measurement unit for measuring wave front aberration in said projection optical system; and
    a corrective drive amount calculator for calculating a corrective drive amount for the reflective element based on a measurement value by the wave front aberration measurement unit.

12. An exposure apparatus comprising:
    a reflective element for reflecting and introducing light from a light source to a plate;
    at least one first driver for providing the reflective element with a force and/or a displacement in at least one directions;
    at least one second driver for providing the reflective element with a force and/or a displacement in at least one directions, wherein said first and second drives are connected in series to each other;
    a projection optical system, provided with said reflective element, for introducing to the plate light from the pattern illuminated by the light from the light source; and
    a wave front aberration measurement unit for measuring wave front aberration in said projection optical system, wherein the reflective element is driven based on a measurement result by said wave front aberration measurement unit,
    wherein said projection optical system includes plural reflective elements, and the corrective drive amount is selectively provided to the plural reflective elements.

13. An exposure apparatus comprising:
    a reflective element for reflecting and introducing light from a light source to a plate;
    at least one first driver for providing the reflective element with a force and/or a displacement in at least one directions;
    at least one second driver for providing the reflective element with a force and/or a displacement in at least one directions, wherein said first and second drives are connected in series to each other;

a projection optical system, provided with said reflective element, for introducing to the plate light from the pattern illuminated by the light from the light source; and a wave front aberration measurement unit for measuring wave front aberration in said projection optical system, wherein the reflective element is driven based on a measurement result by said wave front aberration measurement unit, further comprising a stage for mounting and driving the plate, wherein said wave front aberration measurement unit is provided on the stage.

14. An exposure apparatus comprising:

a reflective element for reflecting and introducing light from a light source to a plate;

at least one first driver for providing the reflective element with a force and/or a displacement in at least one directions;

at least one second driver for providing the reflective element with a force and/or a displacement in at least one directions, wherein said first and second drives are connected in series to each other;

a projection optical system, provided with said reflective element, for introducing to the plate light from the pattern illuminated by the light from the light source; and a wave front aberration measurement unit for measuring wave front aberration in said projection optical system, wherein the reflective element is driven based on a measurement result by said wave front aberration measurement unit, further comprising a stage for mounting and driving the original form, wherein said wave front aberration measurement unit is provided on the stage.

15. A device fabrication method comprising the steps of:

exposing a plate using an exposure apparatus; and developing the plate that has been exposed, wherein the exposure apparatus includes:

an illumination optical system for illuminating a pattern on an original form using light from a light source;

a projection optical system for introducing light from the pattern on the original form to the plate;

at least one first driver for providing a reflective element that reflects light from the light source to the plate, with a force and/or a displacement in at least one directions;

at least one second driver for providing the reflective element with a force and/or a displacement in at least one directions;

a first measurement unit for measuring a relative position between one end and another end of said first driver; and a second measurement unit for measuring a relative position between one end and another end of said second driver.

* * * * *